(12) United States Patent
Shearman et al.

(10) Patent No.: US 6,426,876 B1
(45) Date of Patent: Jul. 30, 2002

(54) CIRCUIT PACK HANDLING SYSTEM

(75) Inventors: Simon E. Shearman, Almonte; Robert C. Templin, Kanata; Sean R. Thompson, Ottawa; Kwong Ng, Nepean; Marius Preda, Hull, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/738,982

(22) Filed: Dec. 19, 2000

(51) Int. Cl.[7] .............................. H05K 7/20; H05K 5/03
(52) U.S. Cl. ..................... 361/726; 211/41; 211/17; 439/372; 361/704
(58) Field of Search ............................. 165/80.3, 185; 361/625, 679, 610, 686–688, 703, 704, 709–711, 715–719, 722, 724, 725, 726, 727, 730, 732, 754, 759, 801, 802, 807, 809; 211/41.17; 312/265.2, 223.1, 223.2; 439/159, 372, 911, 942

(56) References Cited

U.S. PATENT DOCUMENTS

| | | | | |
|---|---|---|---|---|
| 3,634,732 A | * | 1/1972 | Finger et al. ................ | 361/726 |
| 3,808,634 A | * | 5/1974 | Szebo | |
| 4,531,176 A | * | 7/1985 | Beecher, II .................. | 361/816 |
| 4,580,192 A | | 4/1986 | Beun | |
| 4,677,654 A | * | 6/1987 | Lagin et al. ................. | 455/550 |
| 4,886,163 A | * | 12/1989 | Hubbell et al. ............. | 206/707 |
| 5,911,589 A | * | 6/1999 | Chen .......................... | 439/296 |
| 6,231,145 B1 | * | 5/2001 | Liu .......................... | 312/332.1 |

* cited by examiner

Primary Examiner—Gerald Tolin

(57) ABSTRACT

A circuit pack handling system, comprising a handle assembly storage pocket formed in the sidewall of a circuit pack and a carrying handle assembly hinge-mounted within the pocket and adapted to retract substantially within the storage pocket. In a preferred embodiment, the system further comprises a handle locking sub-assembly affixed within the backplane end of the storage pocket between the inner wall of the pocket and the inner leg of the handle assembly to lock the handle assembly into the deployed position. In another preferred embodiment, the system further comprises a coil spring fitted at the gripping member hinge-joint of at least one of the legs so as to spring load the handle assembly whereby the handle assembly automatically flips out from the stored position inside the storage pocket to the deployed position as the circuit pack is pulled away from the shelf frame.

5 Claims, 9 Drawing Sheets

CIRCUIT PACK HANDLING SYSTEM

FIELD OF THE INVENTION

The present invention relates to a circuit pack handling system.

BACKGROUND OF THE INVENTION

Maintaining telecommunications bays requires the periodic removal and installation of major components called circuit packs. Circuit packs are large modules that are difficult to handle because of their size, weight, and awkward location, housed in slots ranging in height from a few inches to over six feet off the ground.

Therefore, since these circuit packs must frequently be lifted over workers heads when being inserted or extracted, what is needed is a good gripping surface that is comfortable to hold. The circuit packs may also be hot at the time of extraction so the gripping surface should remain cool to the touch, insulated from the hot heatsink surface.

Even when cool, handling circuit packs by gripping the heatsink ends is uncomfortable, leaving heatsink fin depressions on your hands. Using installation trays to support the circuit packs during installation would require a separate storage space for the trays and would be a component susceptible to being misplaced. A gripping surface integrated with the circuit pack would not require a separate storage space.

The milling of heatsink fins to provide a comfortable gripping surface would reduce the cooling capacity of the heat sink Placing handles on the front of the circuit pack would take up valuable faceplate real estate and would still require a hand on the heatsink to position the circuit pack into it's card guides. As well, removing the circuit pack by pulling on handles located on the faceplate area would likely result in the circuit pack slamming into the handler's body as it is pulled out beyond the shelf frame's edge.

For the foregoing reasons, there is a need for a system of handling circuit packs that provides for an insulated ergonomic gripping surface that is integrated and unobtrusive.

SUMMARY OF THE INVENTION

The present invention is directed to a circuit pack handling system comprised of a handle assembly storage pocket formed in the sidewall of a circuit pack and a carrying handle assembly hinge-mounted within the pocket and adapted to retract substantially within the storage pocket.

The handle assembly is comprised of at least two legs, an inner leg and an outer leg, of substantially equal length hinge-mounted at their circuit pack ends within the pocket.

A gripping member is hinge-jointed to the extended ends of the legs to form the carrying handle assembly, whereby the legs range between a stored position inside the storage pocket and substantially parallel to the sidewall, and a deployed position outside the storage pocket and substantially perpendicular to the sidewall, the legs pivoting about the sidewall hinge pins with the handle assembly maintaining a substantially parallelogram configuration with the sidewall, the gripping member moving horizontally while remaining substantially parallel with the sidewall.

In a preferred aspect of the invention, the system is further comprised of a handle locking sub-assembly affixed within the backplane end of the storage pocket between the inner wall of the pocket and the inner leg of the handle assembly so as to lock the handle assembly into the deployed position as the handle assembly flips out from the stored position inside the storage pocket to the deployed position. The sub-assembly is comprised of a leaf spring housing top section, a leaf spring housing bottom section, a leaf spring housed within the leaf spring housing sections, a locking member hinge-jointed at one end to the inner leg and the circuit pack end being adapted to interact with the sub-assembly and a locking cavity formed in the leaf spring housing top and bottom sections and adapted to entrap the circuit pack end of the locking member so as to lock the handle assembly into the deployed position.

In another preferred aspect of the invention, the system is further comprised of a coil spring fitted at the gripping member hinge-joint of at least one of the legs, one of the coil spring's ends pressing against the inside of the leg and the other end pressing against the gripping member so as to spring load the handle assembly.

In an aspect of the invention, a circuit pack is adapted for slidable engagement of it's sidewalls between a stored position inside a shelf and an extracted position outside the shelf The circuit pack comprises a handle assemble storage pocket formed in each sidewall of the circuit pack, a handle assembly mounted within the pocket and hinged for movement between a stored position within the pocket and a deployed position in which the handle assembly may be gripped and a spring biassing the handle assembly to the deployed position when the circuit pack is extracted.

This invention will allow easier insertion and extraction of the unwieldy circuit packs without taking up valuable shelf or circuit pack real estate. The invention is ergonomic, helping to prevent injuries that may occur when a person of any size handles such large and heavy objects.

The handles will prevent the handler from having to lift the circuit packs, which can weigh in at about 20–25 lbs, by grabbing the sharp heatsink fin surfaces.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

Figure 1:
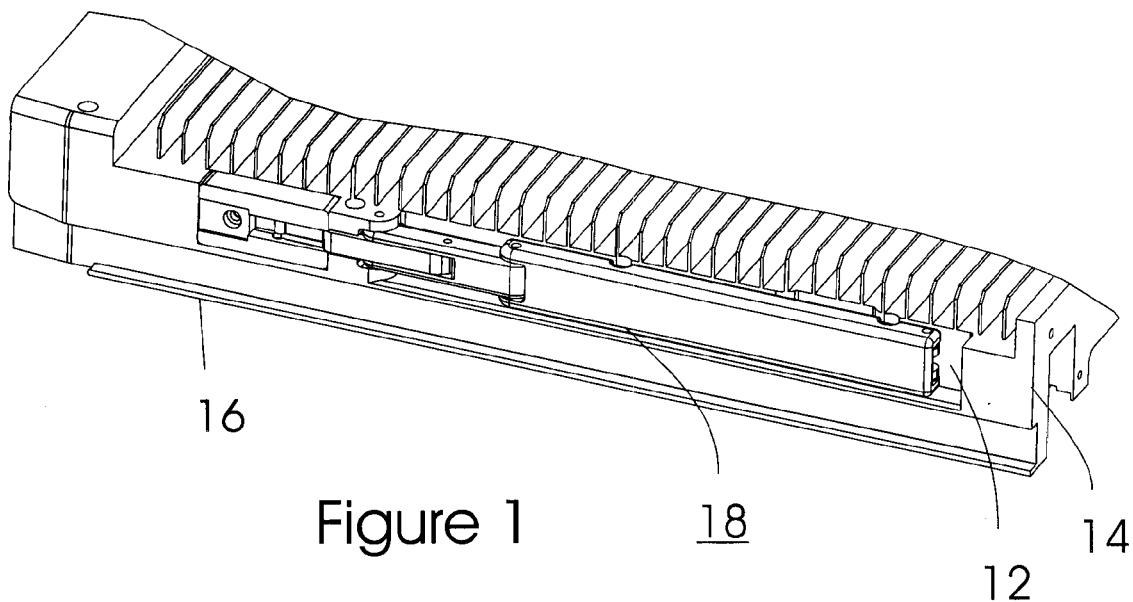
FIG. 1 is a perspective overview of the circuit pack handling system.

As shown in FIG. 1, the configuration of an embodiment of the circuit pack handling system comprises a handle assembly storage pocket 12 formed in the sidewall 14 of a circuit pack 16 and a carrying handle assembly 18 hinge-mounted within the storage pocket 12 and adapted to retract substantially within the pocket 12.

Figure 2:
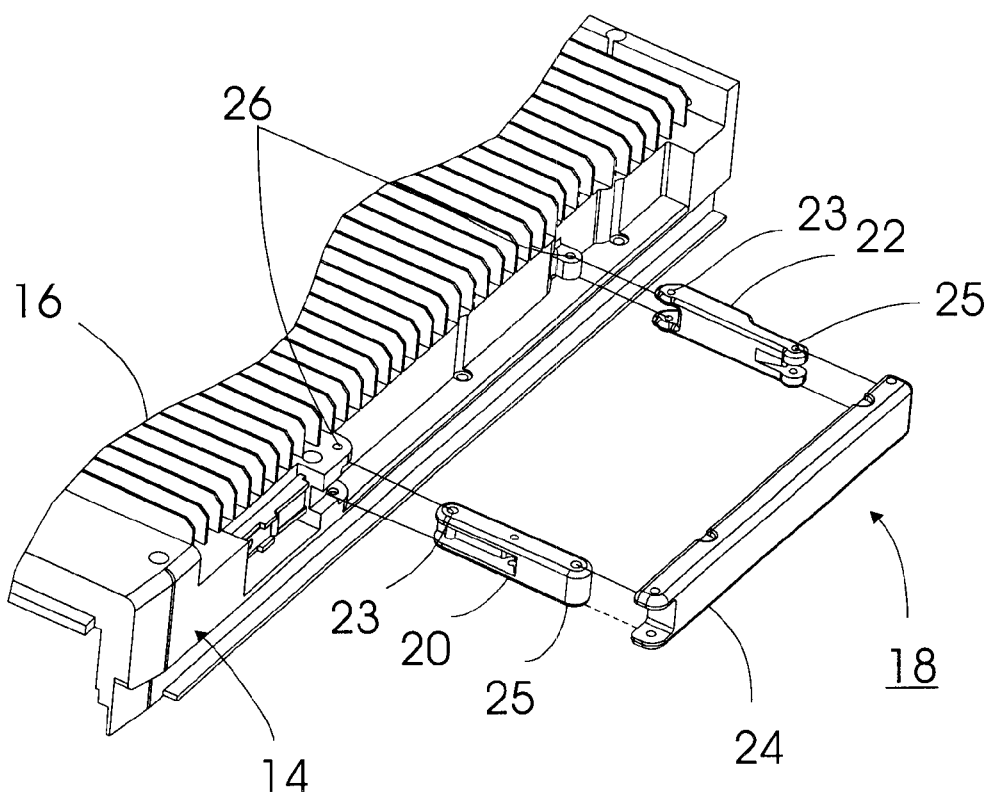
FIG. 2 is an assembly perspective view of the handle assembly hinge-mounted within the pocket of the circuit pack.

As shown in FIG. 2, the handle assembly 18 is comprised of at least two legs 20 and 22, an inner leg 20 and an outer leg 22, of substantially equal length hinge-mounted at their circuit pack ends 23 within the pocket 14. A gripping member 24 is hinge-jointed to the extended ends 25 of the legs 20 and 22 to form the carrying handle assembly 18.

Figure 3:
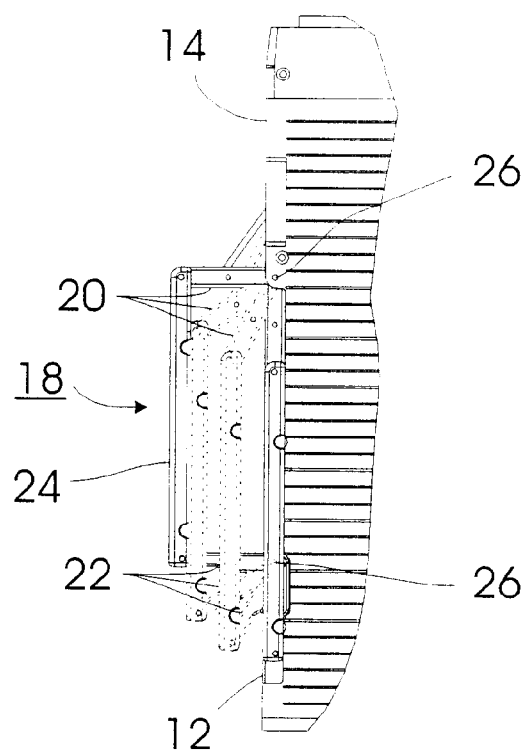
FIG. 3 is a top view of the parallelogram motion of the handle assembly.
Figure 4:
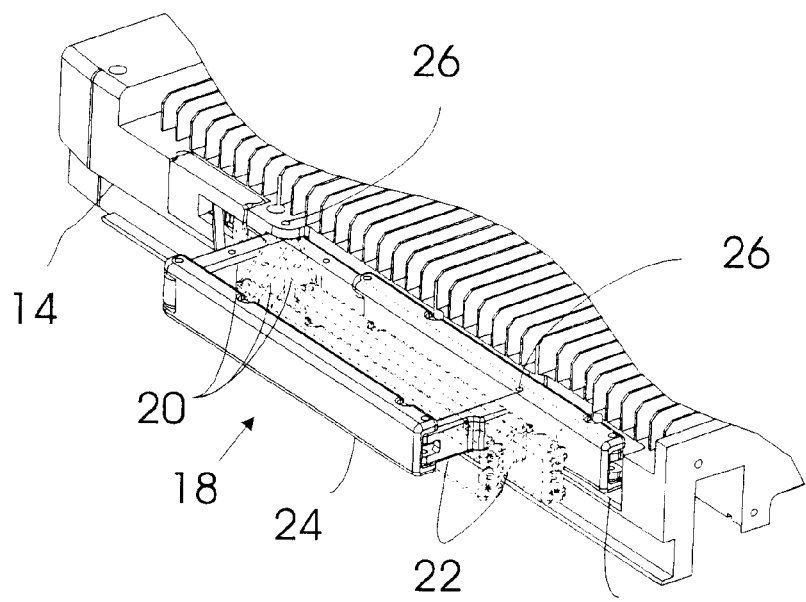
FIG. 4 is a perspective view showing the motion of the handle assembly as it moves from the stored position to the deployed position.

As shown in FIG. 3, the legs 20 and 22 range between a stored position inside the storage pocket 12 and substantially parallel to the sidewall 14, and a deployed position outside the storage pocket 12 and substantially perpendicular to the sidewall 14. As shown in FIG. 4, the legs 20 and 22 pivot about the sidewall hinge pins 26 with the handle assembly 18 maintaining a substantially parallelogram configuration with the sidewall 14, the gripping member 24 moving horizontally while remaining substantially parallel with the sidewall 14.

In preferred embodiments of the invention the handle assembly's two legs 20 and 22 are substantially equal in length and relatively short, with a longer gripping member 24 in between, adapted to fit a handler's hand comfortably around the gripping member 24.

Figure 5:
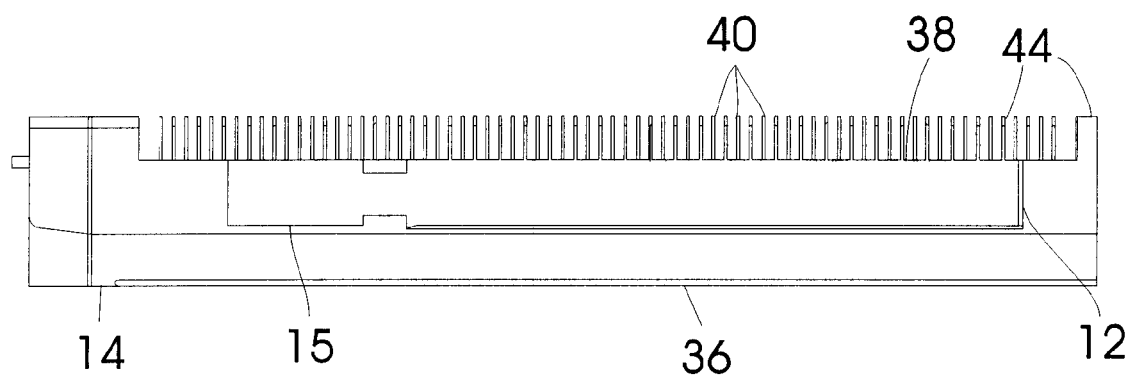
FIG. 5 is an elevation view of the pocket location within the sidewall.
Figure 6:
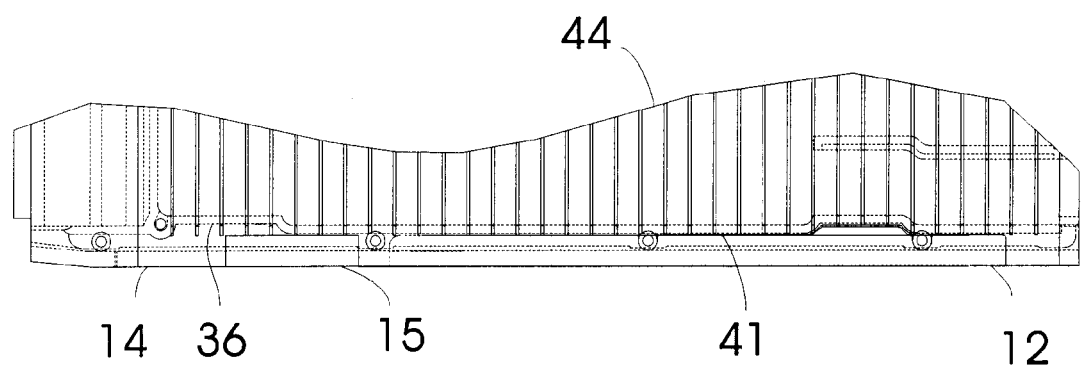
FIG. 6 is a top view of the position of the inner wall of the pocket in relation to the edge-plated board.

The pocket 12 provides a storage location for the handle assembly 18 when the circuit pack 16 is installed and operational within the shelf 34, the handle assembly 18 being adapted to retract and be stored substantially within the pocket 12. As shown in FIG. 5, the pocket 12 is typically formed by milling away a portion of the sidewall 14 above the edge-plated board 36 in order to avoid disrupting the board's 36 electromagnetic seal and below the fin plane 38 in order to prevent the interruption of airflow through the heatsink fins 40 during operation. As well, as shown in FIG. 6, the reach of the inner wall 41 of the pocket 12 ends before any component placement area on the edge-plated board 36 so as to avoid reducing valuable board 36 real estate.

Figure 7:
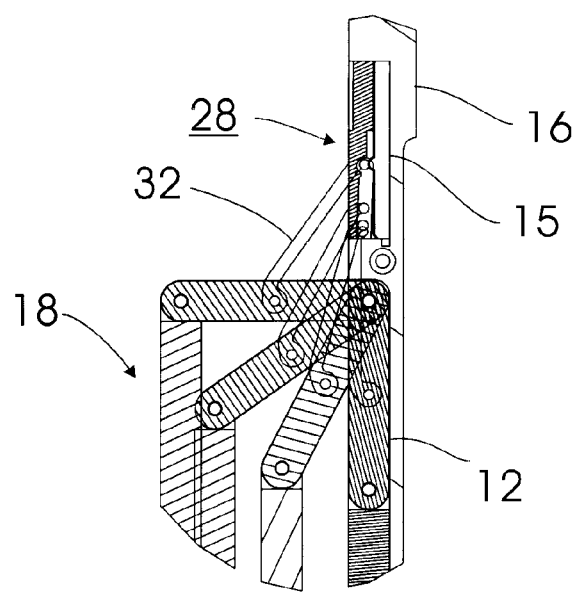
FIG. 7 is a top view of the handle locking sub-assembly.
Figure 8:
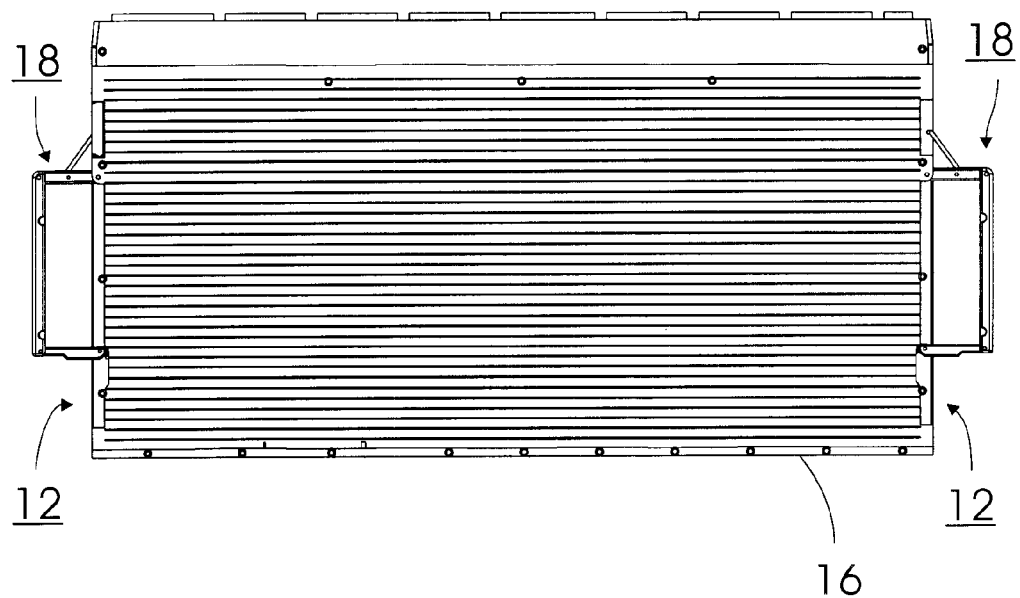
FIG. 8 is a top view of the system implemented in opposing pairs.

As shown in FIG. 7, a preferred embodiment of the invention further comprises a handle locking sub-assembly 28 to lock the handle assembly 18 into the deployed position. As shown in FIG. 8, the system would typically be implemented in opposing pairs, with one system on either side of a circuit pack 16 so that, upon extraction of the circuit pack 16 from the shelf 34, the handle assemblies 18 can be flipped out from their storage pockets 12 on either side and locked into the deployed position.

Figure 9:
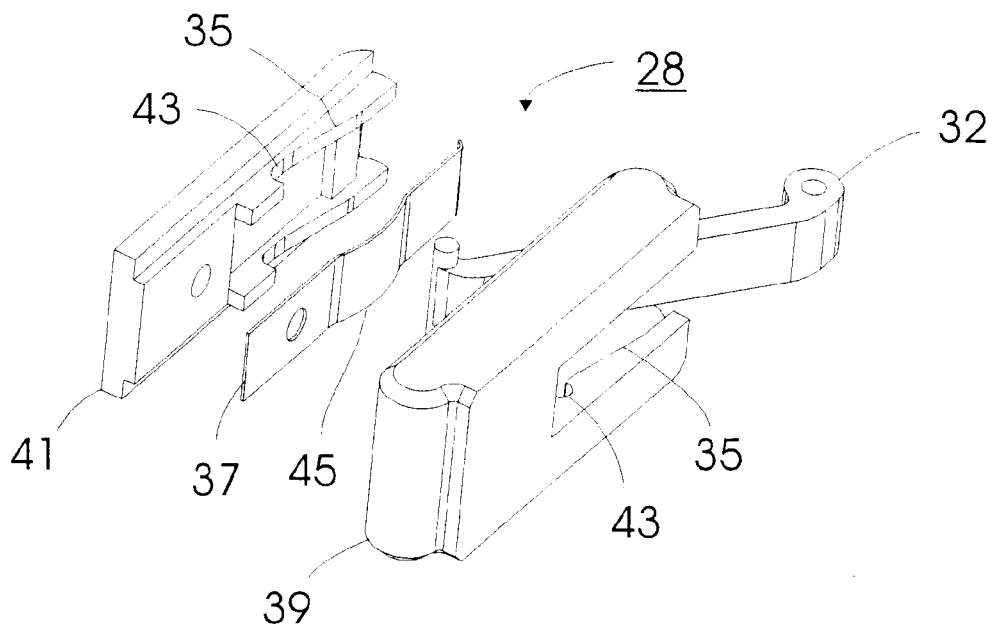
FIG. 9 is an exploded perspective assembly view of the handle locking sub-assembly.

As shown in FIG. 9, the handle locking sub-assembly 28 is affixed within the backplane end 15 of the storage pocket 12 and is comprised of a leaf spring housing top section 39 and bottom section 41, the sections 39 and 41 adapted to house both a leaf spring 37 and the circuit pack end of a locking member 33.

Figure 10:
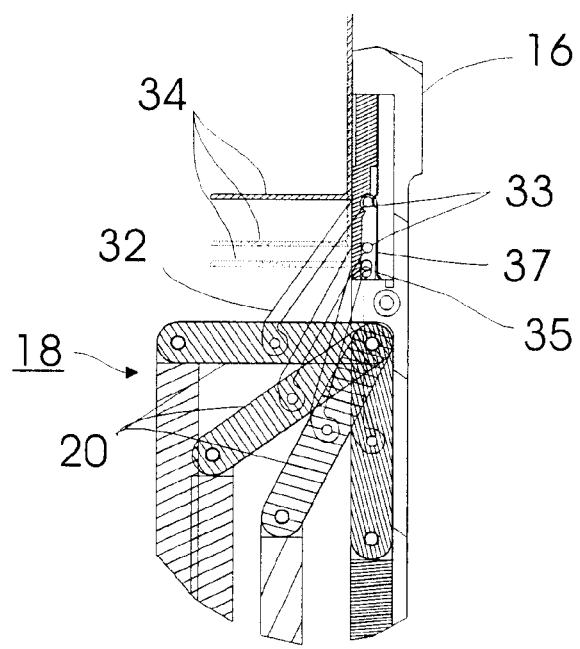
FIG. 10 is a top view of the operation of the handle locking sub-assembly as it interacts with the shelf frame.

As shown in FIG. 10, the leaf spring 37 is housed within the leaf spring housing sections 39 and 41 with the locking member 32 hinge-jointed at one end to the inner leg 20 of the handle assembly 18 and adapted, at it's circuit pack end 33, to interact with the leaf spring 37 so as to lock the handle assembly 18 into the deployed position. The locking member 32 is comprised of a rigid member hinge-jointed at one end to about midway on the inner leg 20, in a substantially diagonal orientation to the handle assembly 18 when in the deployed position, with the circuit pack end 33 housed within a traversing channel 35 formed within the sub-assembly housing sections 39 and 41 and adapted to traverse laterally across the face of the leaf spring 37 as the handle assembly 18 ranges between the stored and deployed positions.

Figure 11:
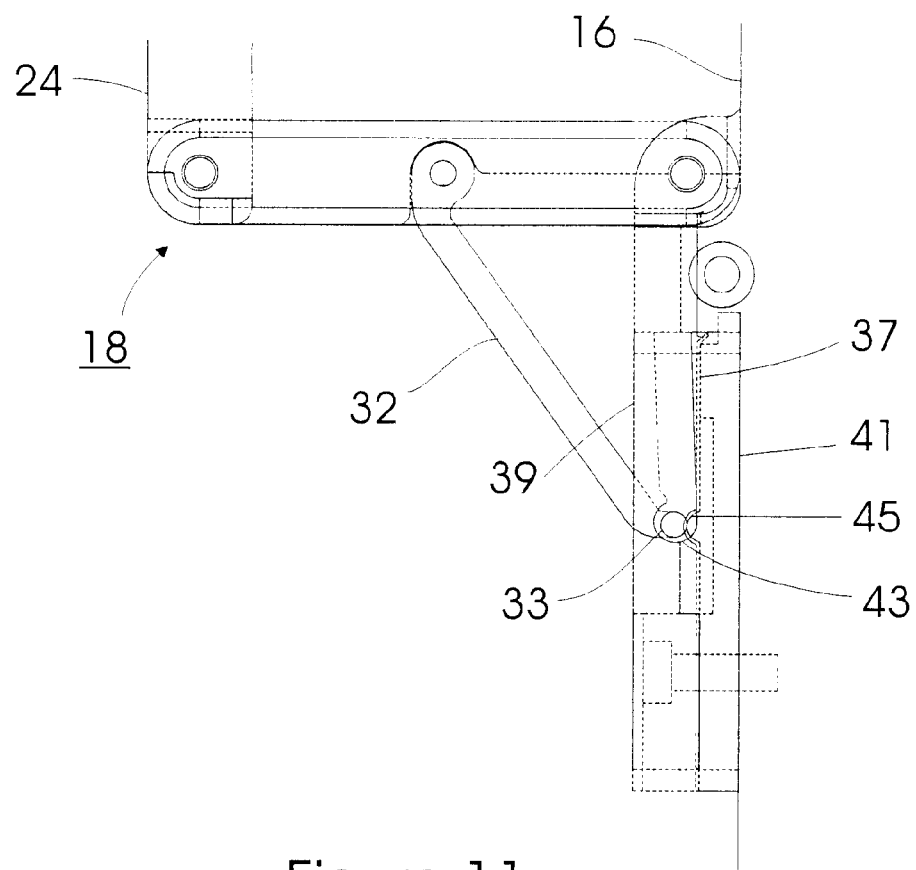
FIG. 11 is a top view of the of the locking member's interaction with the handle locking sub-assembly.
Figure 12:
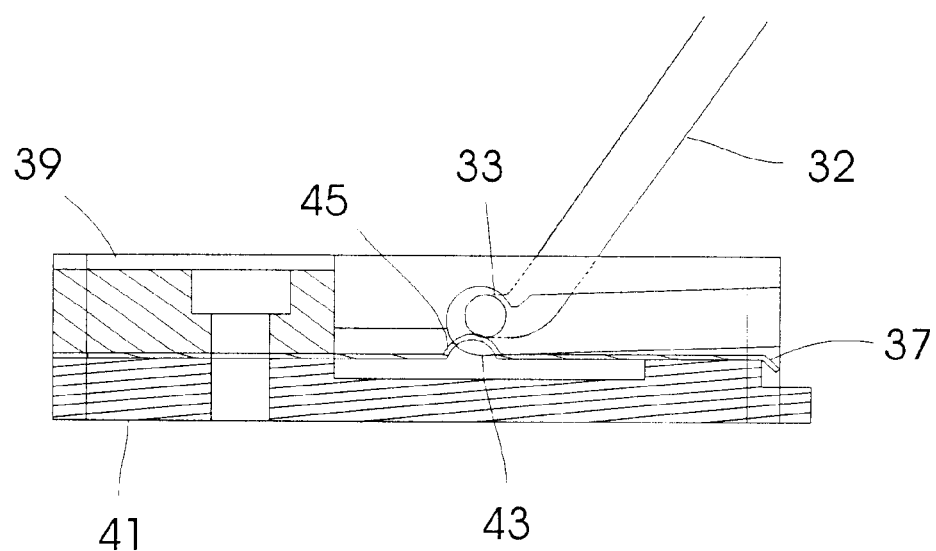
FIG. 12 is an elevation view of the handle locking sub-assembly.

As shown in FIGS. 11 and 12, as the handle assembly 18 approaches the deployed position the locking member's circuit pack end 33, which is adapted to fit tightly within a locking cavity 43 formed in the sub-assembly housing sections 39 and 41, rides-up on a locking ridge 45 formed in the leaf spring 37 entrapping it within the locking cavity 43 locking the handle assembly 18 into the deployed position. The handler is now able to handle the circuit pack 16 by the comfortable gripping members 24.

Figure 13:
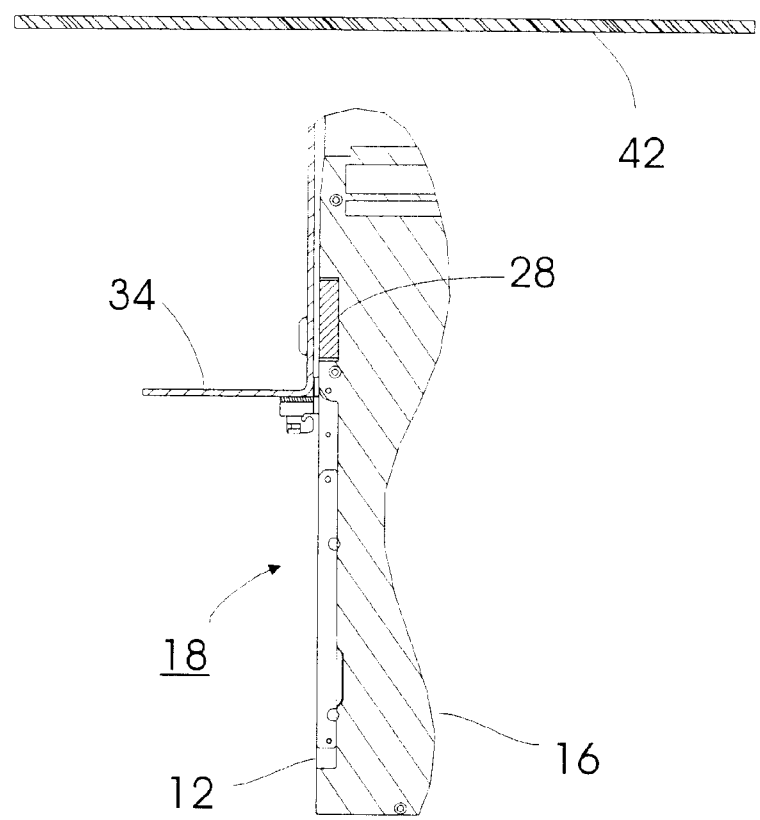
FIG. 13 is a top view of the operation of the invention from the deployed position to the stored position when inserting the circuit pack into the shelf.
Figure 14:
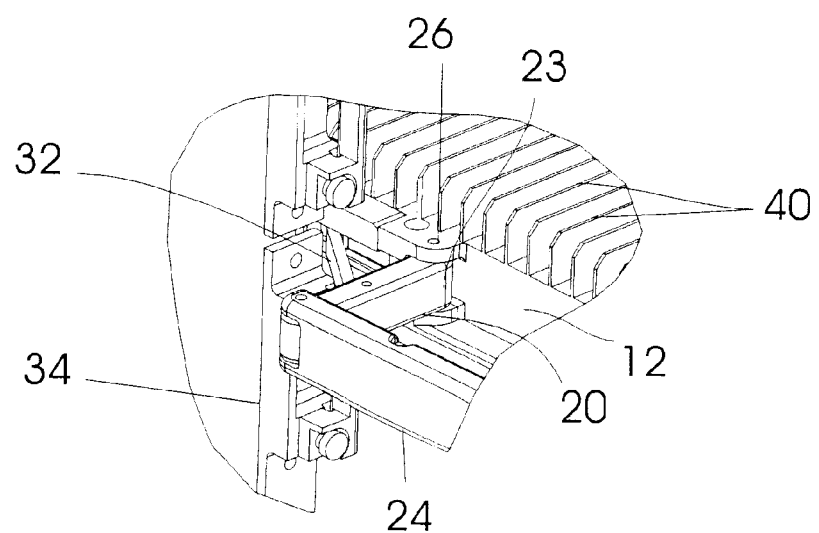
FIG. 14 is a perspective view of the operation of the invention from the deployed position to the stored position when inserting the circuit pack into the shelf.
Figure 15:
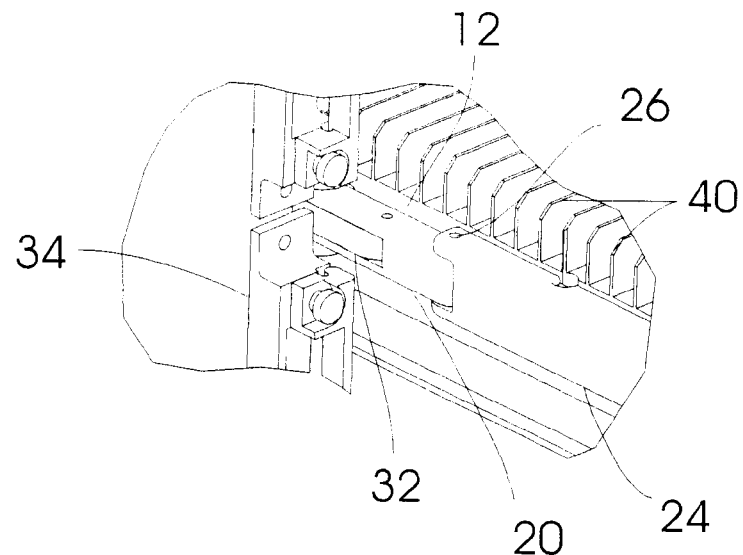
FIG. 15 is a perspective view of the operation of the invention from the deployed position to the stored position when inserting the circuit pack into the shelf.

As shown in FIGS. 13, 14 and 15, during insertion of the circuit pack 16 into the shelf 34, the action of the handler pushing the circuit pack 16 in towards the backplane 42 forces the locking members 32 to automatically disengage from their locking cavities 43 as they encounter the rigid edges of the shelf frame 34. The force stored within the leaf springs 37 that are holding the circuit pack ends 33 of the locking members 32 within the locking cavities 43 is overcome by the force supplied by the action of the handler pushing the circuit pack 16 in towards the backplane 42, thereby forcing the locking members 32 to push against the inner legs 20, resulting in the handle assemblies 18 folding up inside the storage pockets 12, the handle assemblies' 18 outer edges coming to rest substantially flush with the sidewalls 14.

Figure 16:
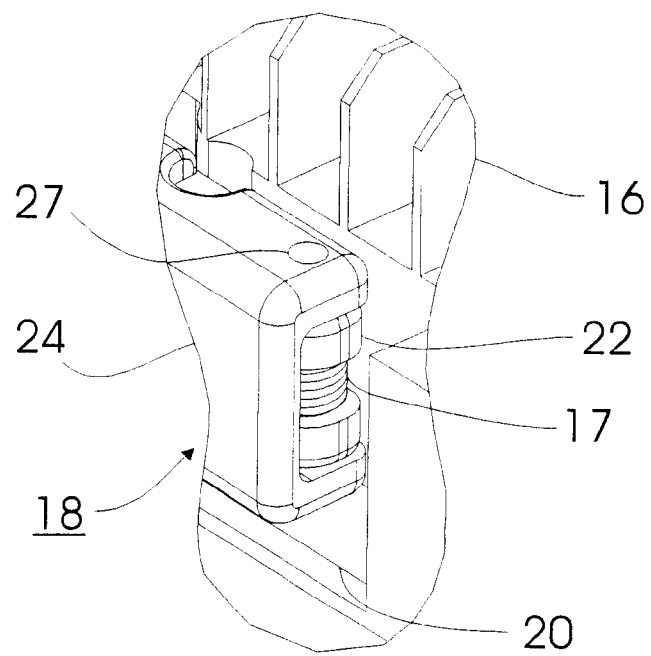
FIG. 16 is a perspective view of the coil spring fitted at the gripping member hinge-joint of the outer leg.
Figure 17:
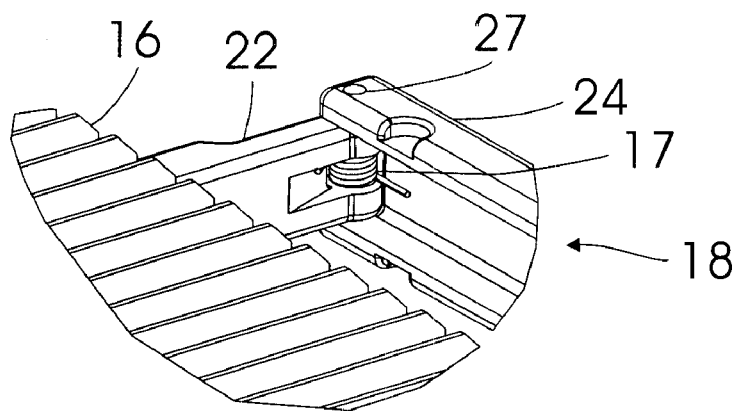
FIG. 17 is a perspective view of the handle assembly showing the coil spring pressing at one end against the outer leg and at the other end against the gripping member to spring load the handle assembly.
Figure 18:
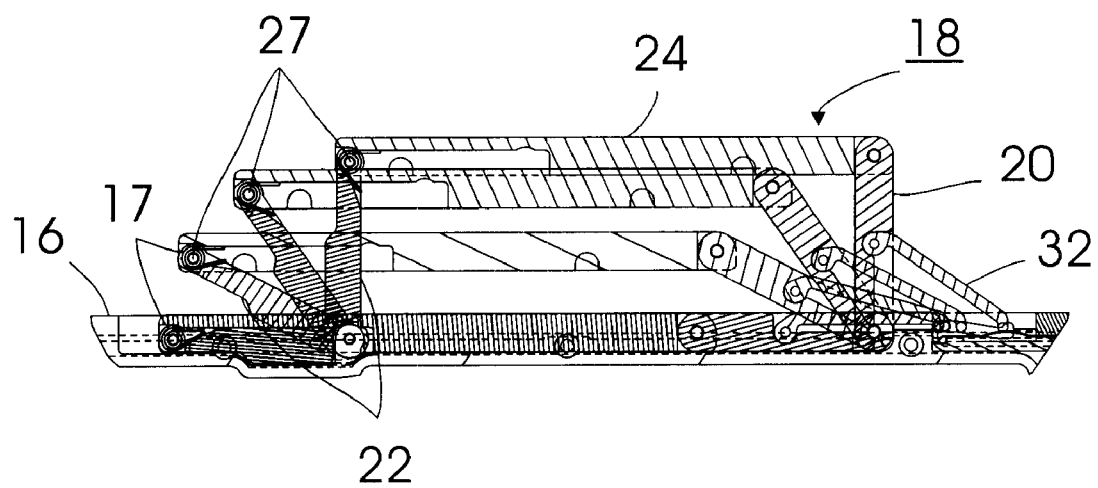
FIG. 18 is a perspective view of the handles automatically flipping out due to the coil spring loading as the circuit pack is removed from the shelf.

As shown in FIG. 16, in a preferred embodiment of the invention, while in the stored position inside the shelf 34, the handle assembly 18 is under spring load from a coil spring 17 fitted at the gripping member hinge-joint 27 of the outer leg 22, one of the coil spring's 17 ends pressing against the inside of the outer leg 22 and the other end pressing against the gripping member 24 so as to spring load the handle assembly 18. As shown in FIG. 18, the force supplied by the coil spring 17 pushing on the handle assembly 18 is unleashed as the circuit pack 16 is removed from the shelf 34, the handle assemblies 18 automatically flipping out from their storage pockets 12 on either side and locking into the deployed position.

This invention will allow easier insertion and extraction of the unwieldy circuit packs 16 without taking up valuable shelf 34 or circuit pack 16 real estate. As well, the invention is ergonomic, helping to prevent injuries that may occur when a person of any size handles such large and heavy objects. The handle assemblies 18 will allow the handler to avoid having to lift the circuit packs 16, which can weigh in at about 20–25 lbs, by grabbing the sharp heatsink fin 40 surfaces.

In a preferred embodiment of the invention the gripping member 24 is comprised of a non-conductive material that remains relatively cool despite being in contact with the heatsink 44 which may be hot at the time of extraction due to circuit pack 16 generated heat.

What is claimed is:

1. A circuit pack handling system comprising:
   a handle assembly storage pocket formed in the sidewall of a circuit pack;
   a carrying handle assembly hinge-mounted within the pocket and adapted to retract substantially within the storage pocket, the handle assembly comprising:
      at least two legs, an inner leg and an outer leg, of substantially equal length hinge-mounted at their circuit pack ends within the pocket; and
      a gripping member hinge-jointed to the extended ends of the legs to form the carrying handle assembly, whereby the legs range between a stored position inside the storage pocket and substantially parallel to the sidewall, and a deployed position outside the storage pocket and substantially perpendicular to the sidewall, the legs pivoting about the sidewall hinge pins with the handle assembly maintaining a substantially parallelogram configuration with the sidewall, the gripping member moving horizontally while remaining substantially parallel with the sidewall; and
   a handle locking sub-assembly affixed within a backplane end of the storage pocket between an inner wall of the pocket and the inner leg of the handle assembly so as to lock the handle assembly into the deployed position, the sub-assembly comprising:
      a leaf spring housing top section;
      a leaf spring housing bottom section;
      a leaf spring housed within the leaf spring housing sections;
      a locking member hinge-jointed at one end to the inner leg and the circuit pack end being adapted to interact with the sub-assembly; and
      a locking cavity formed in the leaf spring housing top and bottom sections and adapted to entrap the circuit pack end of the locking member so as to lock the handle assembly into the deployed position.

2. The system according to claim 1, further comprising a coil spring fitted at the gripping member hinge-joint of at least one of the legs, one of the coil spring's ends pressing against the inside of the leg and the other end pressing against the gripping member so as to spring load the handle assembly.

3. The system according to claim 1, wherein the gripping member is comprised of a nonconductive material to minimize the conduction of circuit pack generated heat.

4. A circuit pack handling system comprising:
   a handle assembly storage pocket formed in the sidewall of a circuit pack;
   a carrying handle assembly hinge-mounted within the pocket and adapted to retract substantially within the storage pocket, the handle assembly comprising:
      at least two legs, an inner leg and an outer leg, of substantially equal length hinge-mounted at their circuit pack ends within the pocket; and
      a gripping member hinge-jointed to the extended ends of the legs to form the carrying handle assembly, whereby the legs range between a stored position inside the storage pocket and substantially parallel to the sidewall, and a deployed position outside the storage pocket and substantially perpendicular to the sidewall, the legs pivoting about the sidewall hinge pins with the handle assembly maintaining a substantially parallelogram configuration with the sidewall, the gripping member moving horizontally while remaining substantially parallel with the sidewall;
   a handle locking sub-assembly affixed within a backplane end of the storage pocket between an inner wall of the pocket and the inner leg of the handle assembly so as to lock the handle assembly into the deployed position, the sub-assembly comprising:
      a leaf spring housing top section;
      a leaf spring housing bottom section;
      a leaf spring housed within the leaf spring housing sections;
      a locking member hinge-jointed at one end to the inner leg and the circuit pack end being adapted to interact with the sub-assembly; and
      a locking cavity formed in the leaf spring housing top and bottom sections and adapted to entrap the circuit pack end of the locking member so as to lock the handle assembly into the deployed position; and
      a coil spring fitted at the gripping member hinge-joint of at least one of the legs, one of the coil spring's ends pressing against the inside of the leg and the other end pressing against the gripping member so as to spring load the handle assembly.

5. The system according to claim 4, wherein the gripping member is comprised of a nonconductive material to minimize the conduction of circuit pack generated heat.

* * * * *